United States Patent
Wu et al.

(10) Patent No.: US 8,362,573 B2
(45) Date of Patent: Jan. 29, 2013

(54) INTEGRATED CIRCUITS AND MANUFACTURING METHODS THEREOF

(75) Inventors: Chung-Cheng Wu, Ju-Bei (TW); Ali Keshavarzi, Los Altos Hills, CA (US); Ka Hing Fung, Hsinchu (TW); Ta-Pen Guo, Cupertino, CA (US); Jiann-Tyng Tzeng, Hsinchu (TW); Yen-Ming Chen, Chu-Pei (TW); Shyue-Shyh Lin, Hsinchu (TW); Shyh-Wei Wang, Hsinchu (TW); Sheng-Jier Yang, Zhubei (TW); Hsiang-Jen Tseng, Hsinchu (TW); David B. Scott, Plano, TX (US); Min Cao, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 268 days.

(21) Appl. No.: 12/787,966

(22) Filed: May 26, 2010

(65) Prior Publication Data
US 2011/0291197 A1 Dec. 1, 2011

(51) Int. Cl.
*H01L 29/76* (2006.01)
(52) U.S. Cl. .................... 257/401; 257/368
(58) Field of Classification Search .............. 257/368, 257/401
See application file for complete search history.

(56) References Cited

U.S. PATENT DOCUMENTS

| | | | | |
|---|---|---|---|---|
| 5,097,297 A | * | 3/1992 | Nakazawa | 257/347 |
| 5,616,940 A | * | 4/1997 | Kato et al. | 257/206 |
| 5,637,899 A | * | 6/1997 | Eimori et al. | 257/347 |
| 5,723,883 A | * | 3/1998 | Gheewalla | 257/204 |
| 5,923,059 A | * | 7/1999 | Gheewala | 257/204 |
| 7,250,657 B2 | * | 7/2007 | Liaw | 257/350 |
| 7,968,447 B2 | | 6/2011 | Lee et al. | |

FOREIGN PATENT DOCUMENTS

KR  10-2009-0126588  12/2009

OTHER PUBLICATIONS

Office Action dated Sep. 26, 2012 from corresponding application No. KR 10-2011-0078272.

* cited by examiner

*Primary Examiner* — Ori Nadav
(74) *Attorney, Agent, or Firm* — Lowe Hauptman Ham & Berner, LLP

(57) ABSTRACT

An integrated circuit includes a first diffusion area for a first type transistor. The first type transistor includes a first drain region and a first source region. A second diffusion area for a second type transistor is spaced from the first diffusion area. The second type transistor includes a second drain region and a second source region. A gate electrode continuously extends across the first diffusion area and the second diffusion area in a routing direction. The first metallic layer is electrically coupled with the first source region. The first metallic layer and the first diffusion area overlap with a first distance. A second metallic layer is electrically coupled with the first drain region and the second drain region. The second metallic layer and the first diffusion area overlap with a second distance. The first distance is larger than the second distance.

20 Claims, 11 Drawing Sheets

US 8,362,573 B2

INTEGRATED CIRCUITS AND MANUFACTURING METHODS THEREOF

TECHNICAL FIELD

The present disclosure relates generally to the field of semiconductor devices, and more particularly, to integrated circuits and method of forming the integrated circuits.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the numbers and dimensions of the various features may be arbitrarily increased or reduced for clarity of discussion.

DETAILED DESCRIPTION

Figure 1A:
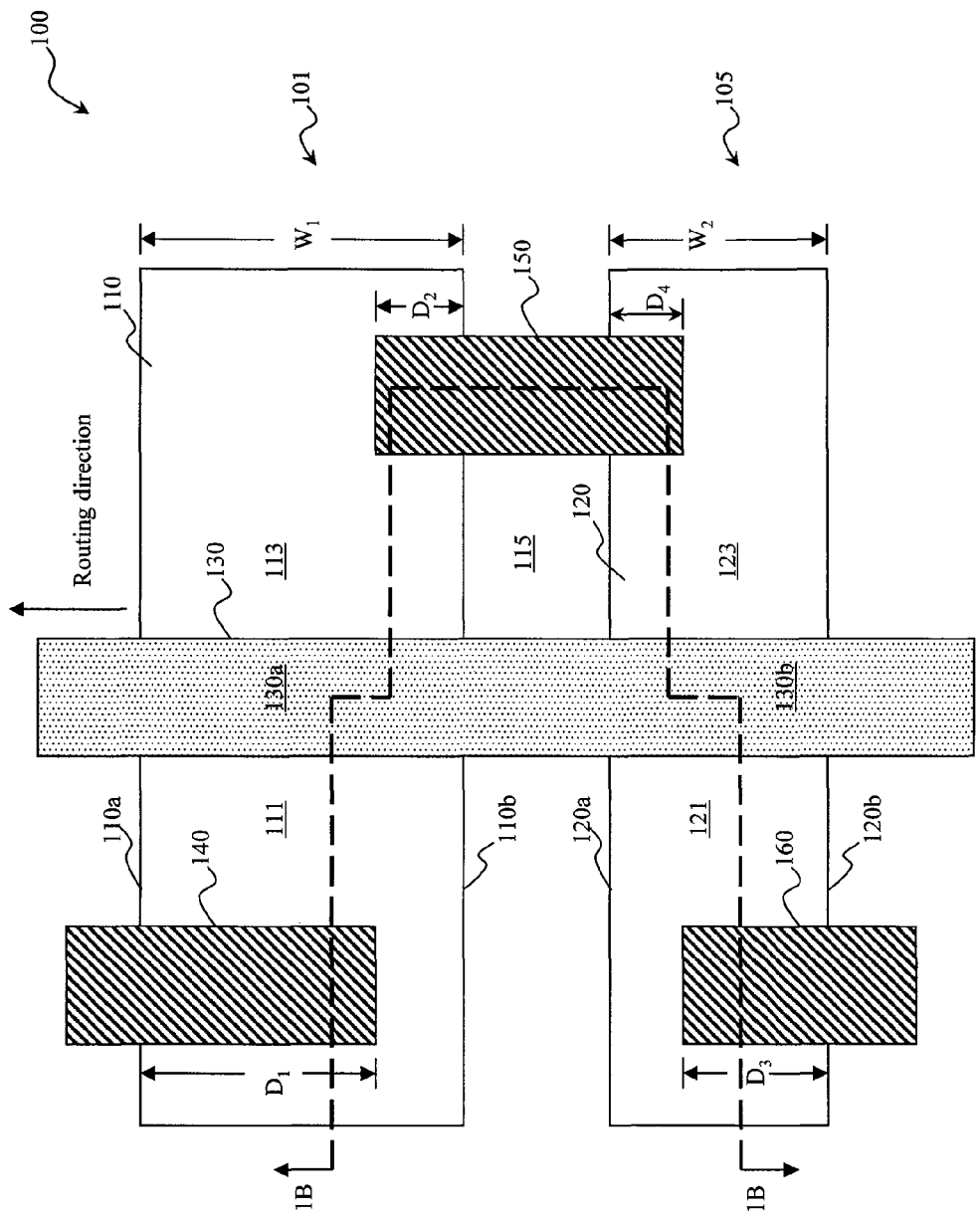
FIG. 1A is a schematic drawing illustrating exemplary layout layers of an exemplary integrated circuit.

For CMOS devices, contact plugs are generally used for electrical connections between source/drain (S/D) regions and metal layers M1 of transistors. Generally, the contact plugs are disposed in contact holes that are formed in an inter-level dielectric (ILD) layer. The contact holes marked on a mask layer are square. The square patterns on the mask layer are transferred on the ILD layer and become rounded. The contact plugs thus have a substantially round shape from a top view that is orthogonal to a surface of a wafer on which the transistors are formed. It is found that if the geometry of the CMOS devices scales down, the S/D resistances of the transistors increase. The increased S/D resistances compromise electrical performances, e.g., operation current, speed, frequency, etc., of the transistors or circuits.

It is understood that the following descriptions provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1A is a schematic drawing illustrating exemplary layout layers of an exemplary integrated circuit. The exemplary drawing shown in FIG. 1A merely depicts overlaps of a diffusion layer, a gate electrode layer, and a metallic layer. In FIG. 1A, an integrated circuit 100 can include a P-type transistor 101 that is electrically coupled with an N-type transistor 105. In some embodiments, the integrated circuit 100 can be a digital circuit, an analog circuit, a mixed-signal circuit, a static random access memory (SRAM) circuit, an embedded SRAM circuit, dynamic random access memory (DRAM) circuit, an embedded DRAM circuit, a non-volatile memory circuit, e.g., FLASH, EPROM, $E^2$PROME, a field-programmable gate circuit, or any combinations thereof. In some embodiments, the P-type transistor 101 and the N-type transistor 105 can be deployed in an inverter, a logic gate circuit, an amplifier, a charge pump circuit, or any circuit that have a CMOS device.

Referring to FIG. 1A, the integrated circuit 100 can include diffusion areas 110 and 120. The diffusion area 110 can include a source region 111 and a drain region 113 of the P-type transistor 101. The diffusion area 120 can include a source region 121 and a drain region 123 of the N-type transistor 105. The diffusion area 110 can be spaced from the diffusion area 120 by an isolation structure 115. The isolation structure 115 can include a shallow trench isolation (STI) structure and/or a local oxidation of silicon (LOCOS) structure. In some embodiments, widths $W_1$ and $W_2$ of the diffusion areas 110 and 120, respectively, are different. In other embodiments, the width $W_1$ of the diffusion area 110 is larger than the width $W_2$ of the diffusion area 120.

Referring to FIG. 1A, a gate electrode 130 can continuously extend across the diffusion areas 110 and 120 in a routing direction of the gate electrode 130. In some embodiments, the gate electrode 130 can include gate electrode portions 130a and 130b for the P-type transistor 101 and the N-type transistor 105, respectively. The gate electrode portions 130a and 130b can be configured to receive voltages, controlling on or off of the P-type transistor 101 and the N-type transistor 105, respectively. It is noted that the routing direction shown in FIG. 1A is merely exemplary. In other embodiments, the routing direction can be in the horizontal direction or any direction that tilts with respect to the horizontal direction.

Referring again to FIG. 1A, a metallic layer 140 can be electrically coupled with the source region 111 of the P-type transistor 101. The metallic layer 140 and the diffusion area 110 can overlap with a distance $D_1$ in the routing direction. A metallic layer 150 can be electrically coupled with the drain regions 113 and 123 of the P-type transistor 101 and the N-type transistor 105, respectively. The metallic layer 150 and the diffusion area 110 can overlap with a distance $D_2$ in the routing direction. The distance $D_1$ is larger than the distance $D_2$. In some embodiments, the metallic layer 140 directly contacts the source region 111. The metallic layer 150 directly contacts the drain regions 113 and 123.

Referring to FIG. 1A, a metallic layer 160 can be electrically coupled with the source region 121 of the N-type transistor 101. The metallic layer 160 and the diffusion area 120 can overlap with a distance $D_3$ in the routing direction. The metallic layer 150 and the diffusion area 120 can overlap with a distance $D_4$ in the routing direction. In some embodiments, the distance $D_3$ is larger than the distance $D_4$. In other embodiments, the distance $D_3$ is larger than the distance $D_2$. In some embodiments, the metallic layer 160 directly contacts the source region 121.

It is noted that the structure shown in FIG. 1A is merely exemplary. In some embodiments, a sum of distances $D_1$ and $D_2$ can be substantially equal to the width $W_1$. In other embodiments, a sum of distances $D_1$ and $D_2$ can be larger or smaller than the width $W_1$. In still other embodiments, a sum of distances $D_3$ and $D_4$ can be substantially equal to the width $W_2$. In yet still other embodiments, a sum of distances $D_3$ and $D_4$ can be larger or smaller than the width $W_2$.

It is also noted that the term "a metallic layer" here can mean a metallic line, a metallic wire, a metallic rope, a metallic string, a metallic code, a metallic slat, or any metallic structure that continuously extends for a predetermined distance. In some embodiments, the metallic layers 140, 150, and 160 can be referred to as a metal zero (M0) layer.

In some embodiments, a ratio of the distance $D_1$ to the width $W_1$ is between about 0.75:1 and 1:1, and a ratio of the distance $D_2$ to the width $W_1$ is between about 0.1:1 and 0.33:1. In other embodiments, a ratio of the distance $D_3$ to the width $W_2$ is between about 0.75:1 and 1:1, and a ratio of the distance $D_4$ to the width $W_2$ is between about 0.1:1 and 0.33:1.

It is noted that the metallic layers 140, 150, and 160 can each at least partially continuously extend over the diffusion areas 110 and/or 120 for electrically coupling the respective source and drain regions. With the at least partially continuously extending structures, the source/drain (S/D) resistances of the transistors can be reduced.

It is also noted that the distances $D_2$ and $D_4$ each do not continuously extend from an edge 110a to an opposite edge 110b of the diffusion area 110 and an edge 120a to an opposite edge 120b of the diffusion area 120, respectively. The metallic layer 150 do not fully cover the diffusion areas 110 and 120 in the routing direction. With the structures, parasitic capacitances between the gate electrode portion 130 to each of the metallic layers 140, 150, and 160, and/or parasitic capacitances among the metallic layers 140, 150, and 160 can be reduced. By modifying the resistances and/or the parasitic capacitances, the electrical characteristics, e.g., operation speed, operation frequency, etc, of the integrated circuit 100 can be desirably achieved.

Table 1 illustrates speed simulations for at least one inverter with various fingers. As shown in Table 1, the structures with $D_1/W_1$, $D_2/W_1$, $D_3/W_2$, and $D_4/W_2$ being 1/1 are used as bases. The base structures each have metallic layers 140, 150, and 160 fully covering the diffusion areas 110 or 120 in the routing direction. The simulation speed of the base structures are presumed as 1.

TABLE 1

| | Ratios of $D_1/W_1$ and $D_3/W_2$ are 1/1 and ratios of $D_2/W_1$ and $D_4/W_2$ are 1/1 | Ratios of $D_1/W_1$ and $D_3/W_2$ are 1/1 and ratios of $D_2/W_1$ and $D_4/W_2$ are 0.33/1 | Ratios of $D_1/W_1$ and $D_3/W_2$ are 0.75/1 and ratios of $D_2/W_1$ and $D_4/W_2$ are 0.33/1 |
|---|---|---|---|
| 1 finger | 1 | 1.096 | 1.104 |
| 4 fingers | 1 | 1.088 | 1.089 |
| 24 fingers | 1 | 1.084 | 1.081 |

Compared with the base structures, exemplary structures with $D_1/W_1$, $D_3/W_2$ being 1/1 and $D_2/W_1$, $D_4/W_2$ being 0.33/1 can provide a speed gain by 9.6%, 8.8%, and 8.4% for 1-finger, 4-fingers, and 24-fingers structures, respectively, as shown in the middle column. Another exemplary structures with $D_1/W_1$, $D_3/W_2$ being 0.75/1 and $D_2/W_1$, $D_4/W_2$ being 0.33/1 can provide a speed gain by 10.4%, 8.9%, and 8.1% for 1-finger, 4-fingers, and 24-fingers structures, respectively, as shown in the right column. It is found that the modification and/or changes of $D_1/W_1$, $D_2/W_1$, $D_3/W_2$, and/or $D_4/W_2$ can achieve unexpected speed gains of inverters.

Figure 1B:
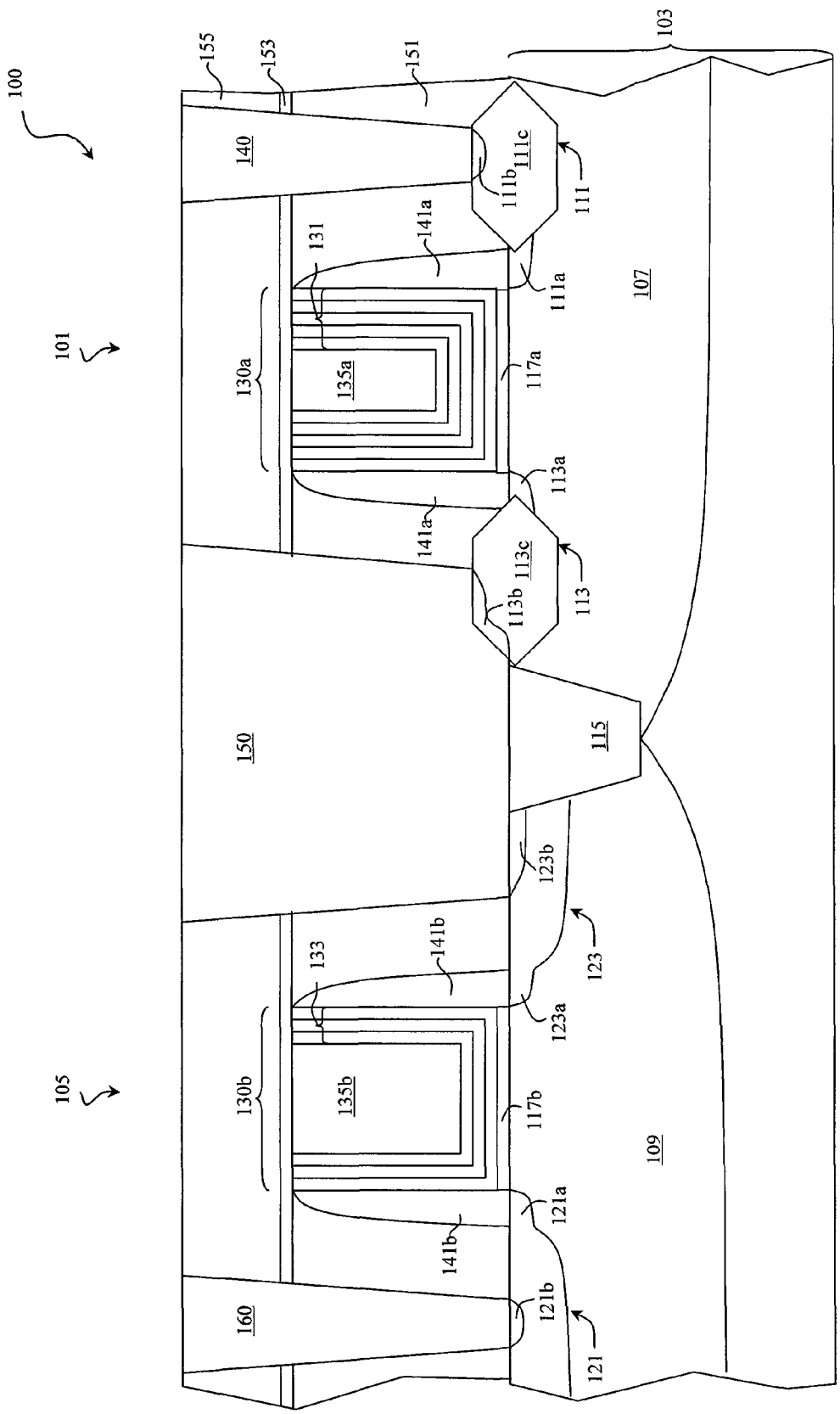
FIG. 1B is a cross-sectional view of an exemplary integrated circuit taken along a section line 1B-1B shown in FIG. 1A.

FIG. 1B is a cross-sectional view of an exemplary integrated circuit taken along a section line 1B-1B shown in FIG. 1A. As noted, FIG. 1A merely illustrates several layout layers of the integrated circuit 100. The cross-sectional view shown in FIG. 1B can depict more features of the integrated circuit 100.

Referring to FIG. 1B, the P-type transistor 101 and the N-type transistor 105 can be formed on a substrate 103. As noted, the P-type transistor 101 and the N-type transistor 105 can be separated by the isolation structure 115. In some embodiments, the substrate 103 may include an elementary semiconductor material, a compound semiconductor material, an alloy semiconductor material, or any other suitable material or combinations thereof. The elementary semiconductor material can include silicon or germanium in crystal, polycrystalline, or an amorphous structure. The compound semiconductor material can include silicon carbide, gallium arsenide, gallium phosphide, indium phosphide, indium arsenide, and indium antimonide. The alloy semiconductor material can include SiGe, GaAsP, AlInAs, AlGaAs, GaInAs, GaInP, and GaInAsP. In one embodiment, the alloy semiconductor substrate may have a gradient SiGe feature in which the Si and Ge composition change from one ratio at one location to another ratio at another location. In another embodiment, the alloy SiGe is formed over a silicon substrate. In another embodiment, a SiGe substrate is strained. Furthermore, the semiconductor substrate may be a semiconductor on insulator, such as a silicon on insulator (SOI), or a thin film transistor (TFT). In some examples, the semiconductor substrate may include a doped epitaxial layer or a buried layer. In other examples, the compound semiconductor substrate may have a multilayer structure, or the substrate may include a multilayer compound semiconductor structure.

In some embodiments, an N-type well region 107 and/or a P-type well region 109 can be optionally formed in the substrate 103 for the P-type transistor 101 and the N-type transistor 105, respectively. The N-type well region 107 can have dopants such as Arsenic (As), Phosphorus (P), other group V elements, or any combinations thereof. The P-type well region 109 can have dopants such as Boron (B) and/or other group III elements.

Figure 2A:
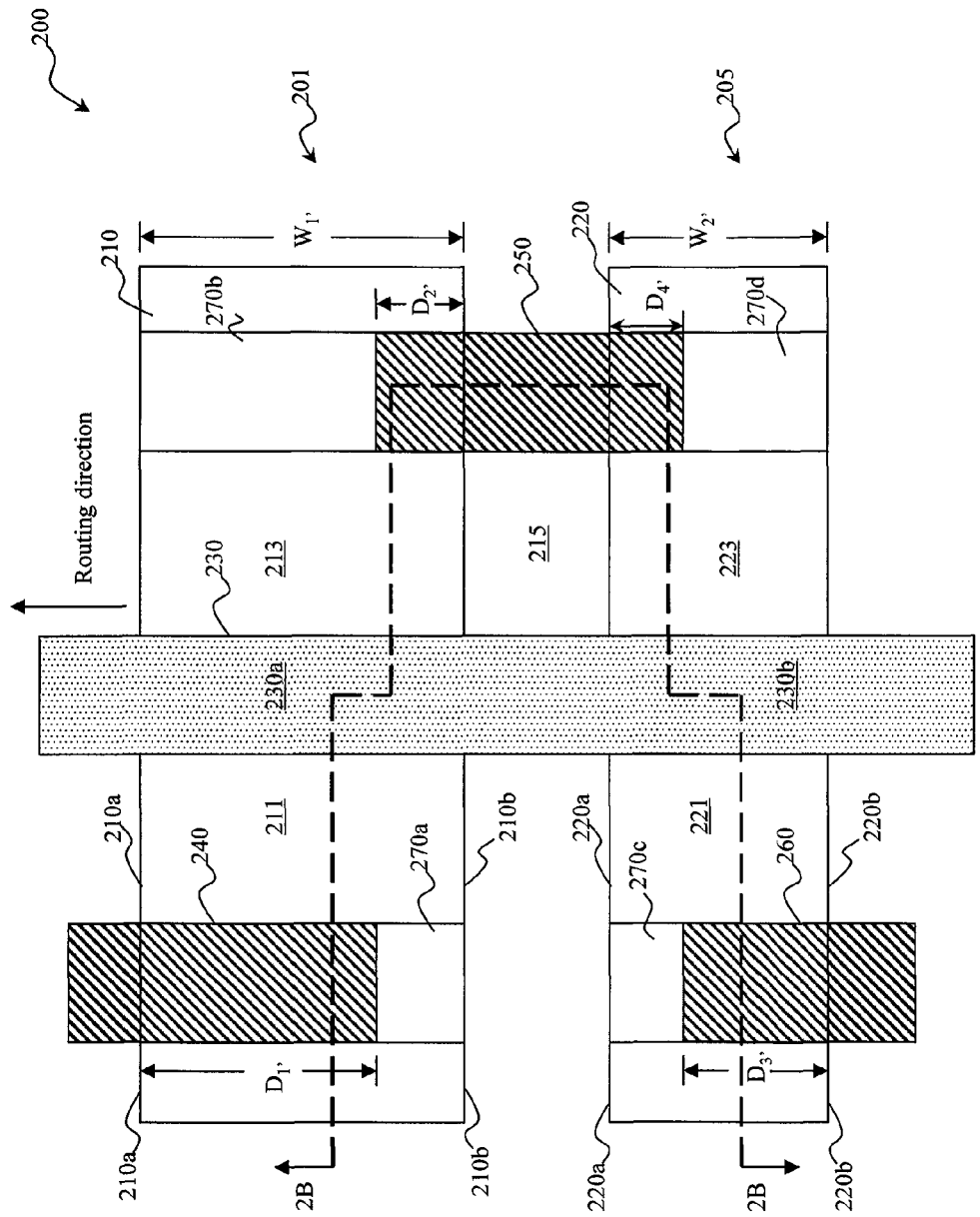
FIG. 2A is a schematic drawing illustrating exemplary layout layers of another exemplary integrated circuit.
Figure 2B:
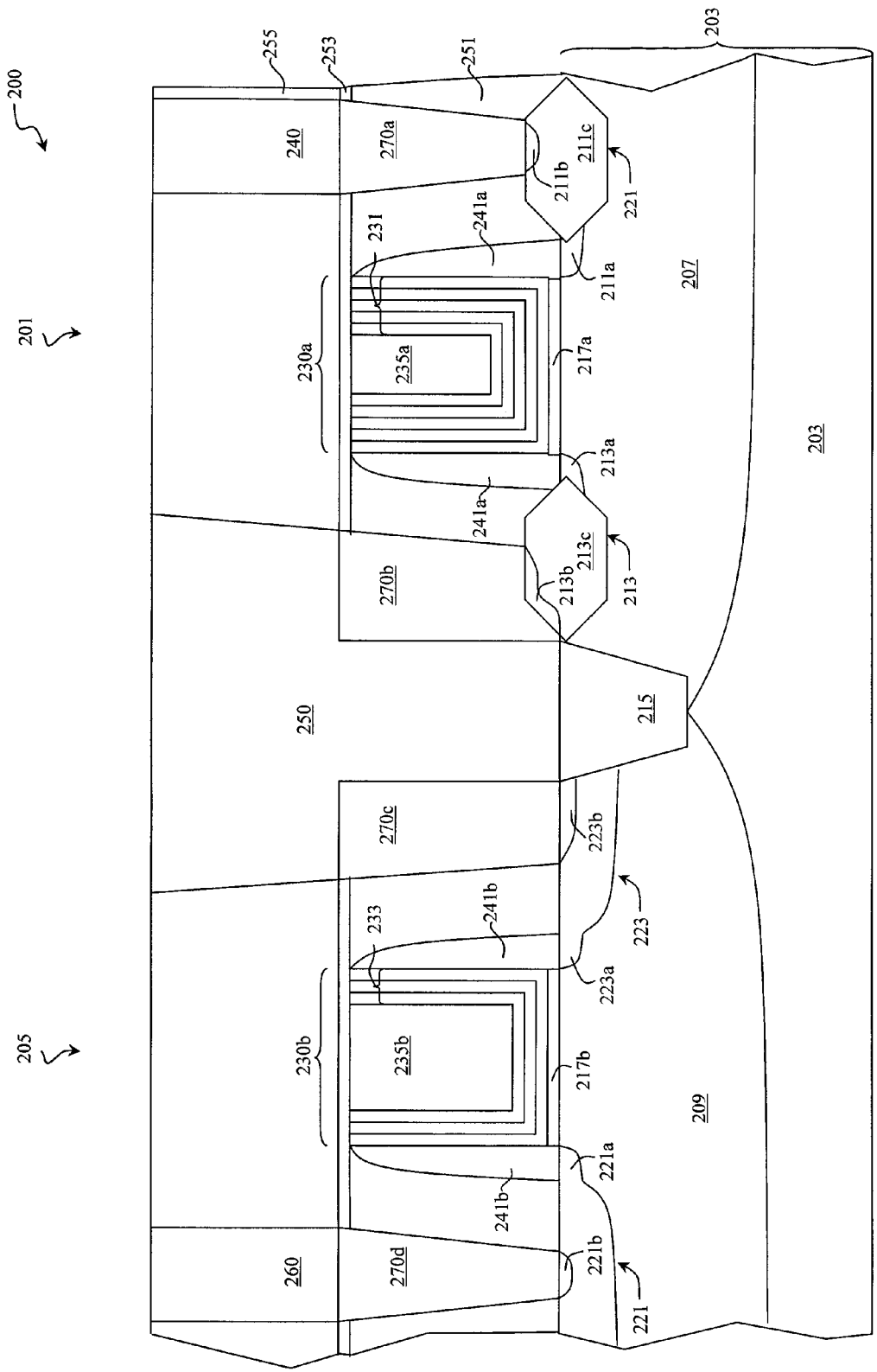
FIG. 2B is a cross-sectional view of an exemplary integrated circuit taken along a section line 2B-2B shown in FIG. 2A.

Referring to FIG. 2B, the P-type transistor 101 can include the source region 111 and the drain region 113. In some embodiments, the source region 111 and the drain region 113 can include structures 111c or 113c, respectively, that can provide a stress to a channel (not labeled) of the P-type transistor 101. The stressed channel can modify a mobility of carriers therein so as to change electrical characteristics, e.g., electrical current, of the P-type transistor 101. In some embodiments, the structures 111c and 113c in the source region 111 and the drain region 113 can be referred to as a raised source and a raised drain, respectively. In other embodiments, the structures 111c and 113c each can include a single SiGe or $Si_xGe_{1-x}$ layer, a multi-layer SiGe or $Si_xGe_{1-x}$ structure, an epitaxial structure, a compound material structure, other materials that can modify the carrier mobility of the P-type transistor 101, or any combinations thereof.

In some embodiments, the source region 111 and the drain region 113 can optionally include P-type lightly-doped drains (LDDs) 111a and 113a, respectively. The P-type LDDs 111a and 113a can each have a dopant type that is opposite to that of the N-type well region 107. In other embodiments, the source region 111 and the drain region 113 can include silicide regions 111b and 113b, respectively. The silicide regions 111b and 113b may comprise at least one material such as nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), other suitable materials, or any combinations thereof.

Referring again to FIG. 2B, the gate electrode portion 130a can include an interfacial dielectric layer 117a. The interfacial dielectric layer 117a can be disposed over the substrate 103. The interfacial dielectric layer 117a may include a material such as silicon oxide, silicon nitride, silicon oxynitride, other gate dielectric materials, or any combinations thereof.

In some embodiments, the gate electrode portion 130a can include a multi-layer structure 131 that can include at least one high dielectric constant (high-k) layer and at least one metal work function layer. The at least one high-k dielectric layer can be formed over the interfacial layer 117a. The high-k dielectric layer can include high-k dielectric materials such as $HfO_2$, HfSiO, HfSiON, HfTaO, HfSiO, HfZrO, other suitable high-k dielectric materials, or any combinations thereof. In some embodiments, the high-k material may further be selected from metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina alloy, other suitable materials, or any combinations thereof.

In some embodiments, the at least one metal work function layer of the multi-layer structure 131 can include at least one P-metal work function layer and at least one N-metal work function layer. In other embodiments, the at least one metal work function layer of the gate electrode portion 130a can solely include at least one P-metal work function layer without any N-metal work function layer. In some embodiments, P-type work function materials can include compositions such as ruthenium, palladium, platinum, cobalt, nickel, and conductive metal oxides, and/or other suitable materials. N-type metal materials can include compositions such as hafnium, zirconium, titanium, tantalum, aluminum, metal carbides (e.g., hafnium carbide, zirconium carbide, titanium carbide, aluminum carbide), aluminides, and/or other suitable materials.

In some embodiments, the multi-layer structure 131 can include at least one diffusion barrier. The at least one diffusion barrier can be disposed between the gate dielectric material and the work function metal material. The diffusion barrier can be configured to prevent metallic ions of the work function metal material from diffusing into the gate dielectric material. The diffusion barrier may comprise at least one material such as aluminum oxide, aluminum, aluminum nitride, titanium, titanium nitride (TiN), tantalum, tantalum nitride, other suitable material, and/or combinations thereof.

Referring to FIG. 1B, the gate electrode portion 130a can include a conductive layer 135a. The conductive layer 135a can be surrounded by the multi-layer structure 131. The conductive layer 135a can be made of at least one material, such as aluminum, copper, Ti, TiN, TaN, Ta, TaC, TaSiN, W, WN, MoN, MoON, $RuO_2$, and/or other suitable materials.

Referring again to FIG. 1B, the N-type transistor 105 can include the source region 121 and the drain region 123. In some embodiments, the source region 121 and the drain region 123 can optionally include N-type lightly-doped drains (LDDs) 121a and 123a, respectively. The N-type LDDs 121a and 123a can have a dopant type that is opposite to that of the P-type well region 109. In other embodiments, the source region 121 and the drain region 123 can include silicide regions 121b and 123b, respectively. The silicide regions 121b and 123b can have a metallic material that is same as or similar to that of the silicide regions 111b and 113b.

In other embodiments, the source region 121 and the drain region 123 can each include a stress structure (not shown). The stress structures can modify the carrier mobility in the channel of the N-type transistor 105. In some embodiments, the stress structures can each include a single SiC or $Si_xC_{1-x}$ layer, a multi-layer SiC or $Si_xC_{1-x}$ structure, an epitaxial structure, a compound material structure, other materials that can modify the carrier mobility of the N-type transistor 105, or any combinations thereof.

Referring again to FIG. 2B, the gate electrode portion 130b can include an interfacial dielectric layer 117b. The interfacial dielectric layer 117b can be disposed over the substrate 103. The interfacial dielectric layer 117b may include a material such as silicon oxide, silicon nitride, silicon oxynitride, other gate dielectric materials, and/or combinations thereof.

In some embodiments, the gate electrode portion 130b can include a multi-layer structure 133 that can include at least one high dielectric constant (high-k) layer and at least one metal work function layer. The at least one high-k dielectric layer can be formed over the interfacial layer 117b. In some embodiments, the at least one high-k dielectric layer of the multi-layer structure 133 can be as same as or similar to that of the multi-layer structure 131.

In some embodiments, the at least one metal work function layer of the gate electrode portion 130b can solely include at least one N-type metal work function layer without any P-type metal work function layer. In some embodiments, N-type metal materials can include compositions such as hafnium, zirconium, titanium, tantalum, aluminum, metal carbides (e.g., hafnium carbide, zirconium carbide, titanium carbide, aluminum carbide), aluminides, and/or other suitable materials.

In some embodiments, the multi-layer structure 133 can include at least one diffusion barrier. The at least one diffusion barrier can be disposed between the gate dielectric material and the work function metal material. The diffusion barrier can be configured to prevent metallic ions of the work function metal material from diffusing into the gate dielectric material. The diffusion barrier may comprise at least one material such as aluminum oxide, aluminum, aluminum nitride, titanium, titanium nitride (TiN), tantalum, tantalum nitride, other suitable material, and/or combinations thereof.

Referring to FIG. 1B, the gate electrode portion 130b can include a conductive layer 135b. The conductive layer 135b can be surrounded by the multi-layer structure 133. The conductive layer 135b can be made of at least one material that is the same as or similar to that of the conductive layer 135a.

Referring to FIG. 1B, spacers 141a and 141b can be optionally disposed on sidewalls of the gate electrode portions 130a and 130b, respectively. The spacers 141a and 141b can be made of at least one material, such as silicon oxide, silicon nitride, silicon oxynitride, other dielectric materials, or any combinations thereof.

Referring to FIG. 1B, at least one dielectric layer 151 can be disposed over the substrate 103 and around the spacers 141a and 141b. The at least one dielectric layer 151 can include at least one material such as phosphorous-doped silicate glass (PSG), boron-doped silicate glass (BSG), boron-phosphorous-doped silicate glass (BPSG), undoped silicate glass (USG), silicon oxide, silicon oxide, silicon nitride, silicon oxynitride, low-k dielectric material, other dielectric materials, or combinations thereof.

In some embodiments, at least one etch stop layer (ESL) 153 can be disposed over the at least one dielectric layer 151. The at least one ESL 153 can include at least one material such as silicon nitride, silicon oxynitride, silicon carbide, silicon oxycarbide, other dielectric materials, or any combinations thereof.

Referring to FIG. 1B, at least one dielectric layer 153 can be disposed over the at least one ESL 153. The at least one dielectric layer 153 can include at least one material such as silicon oxide, e.g., plasma-enhanced oxide (PEOX), undoped silicate glass (USG), phosphorous-doped silicate glass (PSG), boron-doped silicate glass (BSG), boron-phosphorous-doped silicate glass (BPSG), silicon oxide, silicon oxide, silicon nitride, silicon oxynitride, low-k dielectric material, other dielectric materials, or combinations thereof.

In FIG. 1B, the metallic layers 140, 150, and 160 can be disposed through the dielectric layers 151, 155, and the ESL 153. In some embodiments, the metallic layers 140, 150, and 160 can each include at least one barrier layer (not shown) at their bottom regions. The barrier layer may comprise at least one material such as aluminum oxide, aluminum, aluminum nitride, titanium, titanium nitride (TiN), tantalum, tantalum nitride, other suitable material, and/or combinations thereof. In other embodiments, the metallic layers 140, 150, and 160 can each be made of at least one material, such as aluminum, copper, Ti, TiN, TaN, Ta, TaC, TaSiN, W, WN, MoN, MoON, RuO$_2$, and/or other suitable materials.

In some embodiments, the metallic layers 140 and 160 can directly contact the source regions 111 and 121, respectively. The metallic layer 150 can directly contact the drain regions 113 and 123. In other embodiments, the metallic layers 140 and 160 can directly contact the silicide regions 111b and 121b, respectively. The metallic layer 150 can directly contact the silicide regions 113b and 123b.

In some embodiments, other dielectric materials, via plugs, metallic regions, and/or metallic lines (not shown) can be formed over the gate electrode portions 130a and 130b for interconnection. The dielectric layers may include materials such as silicon oxide, silicon nitride, silicon oxynitride, low-k dielectric material, ultra low-k dielectric material, or any combinations thereof. The via plugs, metallic regions, and/or metallic lines can include materials such as tungsten, aluminum, copper, titanium, tantalum, titanium nitride, tantalum nitride, nickel silicide, cobalt silicide, other proper conductive materials, and/or combinations thereof. The via plugs, metallic regions, and/or metallic lines can be formed by any suitable processes, such as deposition, photolithography, and etching processes, and/or combinations thereof.

FIG. 2A is a schematic drawing illustrating exemplary layout layers of another exemplary integrated circuit. Items of FIG. 2A that are the same items in FIG. 1A are indicated by the same reference numerals, increased by 100. In FIG. 2A, an integrated circuit 200 can include a plurality of metallic layer, e.g., metallic layers 270a-270d, each directly contacting one of source regions 211, 221 and drain regions 213, 223. In some embodiments, the metallic layers 270a-270d can at least partially overlap respective metallic layers 240, 250, and 260 in the routing direction.

In some embodiments, the width of each of the metallic layers 270a-270d can be substantially equal the respective metallic layers 240, 250, and 260. In other embodiments, the metallic layers 270a-270d can be wider or narrower than the respective metallic layers 240, 250, and 260. In some embodiments, the metallic layers 270a-270d can be referred to as an M01 metal layers and the metallic layers 240, 250, and 260 can be referred to as an M02 metal layers.

In some embodiments, the metallic layers 270a-270d can each continuously extend from an edge 210a to an opposite edge 210b of the diffusion area 210 or an edge 220a to an opposite edge 220b of the diffusion area 220. In other embodiments, the metallic layers 270a-270b can each extend over or shorten from the edges 210a-210b by a distance that is about 5% of a width $W_{1'}$ of the diffusion area 210 or less. In still other embodiments, the metallic layers 270c-270d can each extend over or shorten from the edges 220a-220b by a distance that is about 5% of a width $W_{2'}$ of the diffusion area 220 or less.

In some embodiments, the metallic layer 240 and the diffusion area 210 can overlap with a distance $D_{1'}$ in the routing direction. The metallic layer 250 and the diffusion area 210 can overlap with a distance $D_{2'}$ in the routing direction. The distance $D_{1'}$ is larger than the distance $D_{2'}$. The metallic layer 260 and the diffusion area 220 can overlap with a distance $D_{3'}$ in the routing direction. The metallic layer 250 and the diffusion area 220 can overlap with a distance $D_{4'}$ in the routing direction. In some embodiments, the distance $D_{3'}$ is larger than the distance $D_{4'}$. In other embodiments, the distance $D_{3'}$ is larger than the distance $D_{2'}$. In still other embodiments, the distances $D_1$, $D_2$, $D_3$, and/or $D_4$ described above in conjunction with FIG. 1A can be larger than the distances $D_{1'}$, $D_{2'}$, $D_{3'}$, and/or $D_{4'}$, respectively.

In some embodiments, a sum of distances $D_{1'}$ and $D_{2'}$ can be substantially equal to the width $W_{1'}$. In other embodiments, a sum of distances $D_{1'}$ and $D_{2'}$ can be larger or smaller than the width $W_{1'}$. In still other embodiments, a sum of distances $D_{3'}$ and $D_{4'}$ can be substantially equal to the width $W_{2'}$. In yet still other embodiments, a sum of distances $D_{3'}$ and $D_{4'}$ can be larger or smaller than the width $W_{2'}$.

FIG. 2B is a cross-sectional view of an exemplary integrated circuit taken along a section line 2B-2B shown in FIG. 2A. In FIG. 2B, the metallic layers 270a-270d can directly contact the source region 211, the drain regions 213, 223, and the source region 221, respectively. The metallic layers 240, 250, and 260 can be electrically coupled with the source region 211, the drain regions 213, 223, and the source region 221 through the metallic layers 270a-270d, respectively. In some embodiments, the metallic layers 270a-270d can be disposed through the dielectric layer 251 and the ESL 253, directly contacting the silicide regions 211b, 213b, 221b, and 223b, respectively.

In some embodiments, the metallic layers 270a-270d can each include at least one barrier layer (not shown) at their bottom regions. The barrier layer may comprise at least one material such as aluminum oxide, aluminum, aluminum nitride, titanium, titanium nitride (TiN), tantalum, tantalum nitride, other suitable material, and/or combinations thereof. In some embodiments, the metallic layers 270a-270d each can be made of at least one material, such as aluminum, copper, Ti, TiN, TaN, Ta, TaC, TaSiN, W, WN, MoN, MoON, $RuO_2$, and/or other suitable materials. In other embodiments, the metallic layers 270a-270d can each be made of tungsten, and the metallic layers 240, 250, and 260 can each be made of copper.

In some embodiments, top surfaces of the metallic layers 270a-270d can be substantially level with top surfaces of conductive layers 235a and 235b. The term "substantially level with" here can mean that the top surfaces of the metallic layers 270a-270d can be higher than the top surfaces of the conductive layers 235a and 235b by a distance, e.g., the thickness of the ESL 253. In some embodiments, the term "substantially level with" here can mean that the top surfaces of the metallic layers 270a-270d can be lower than the top surface of the ESL 253 due to a dishing effect on the top surfaces of the metallic layers 270a-270d resulting from an etch-back process or a chemical-mechanical polish (CMP) process. In other embodiments, the term "substantially level with" here can mean that the top surfaces of the metallic layers 270a-270d can be lower than the top surfaces of the conductive layers 235a and 235b due to a dishing effect on the top surfaces of the metallic layers 270a-270d resulting from an etch-back process or a chemical-mechanical polish (CMP) process.

Referring to FIG. 2A-2B, it is found that the metallic layers 270a-270d can be deployed for electrical connections between the metallic layers 240, 250, and 260 and the respective source region 211, the drain regions 213, 223, and the source region 221. The metallic layers 270a-270d can substantially cover the respective diffusion areas 210 and 220 in the routing direction. The resistances from the metallic layers 270a-270d to the source and drain regions can be desirably reduced. In some embodiments, the overlap distances $D_1$-$D_4$, of the metallic layers 240, 250, and 260 that are deployed for electrical connections can be reduced. It is also found that the top surfaces of the metallic layers 270a-270d can be substantially level with the top surfaces of conductive layers 235a and 235b. Parasitic capacitances between the metallic layers 270a and 270b and between the metallic layers 270c and 270d are low.

Figure 3:
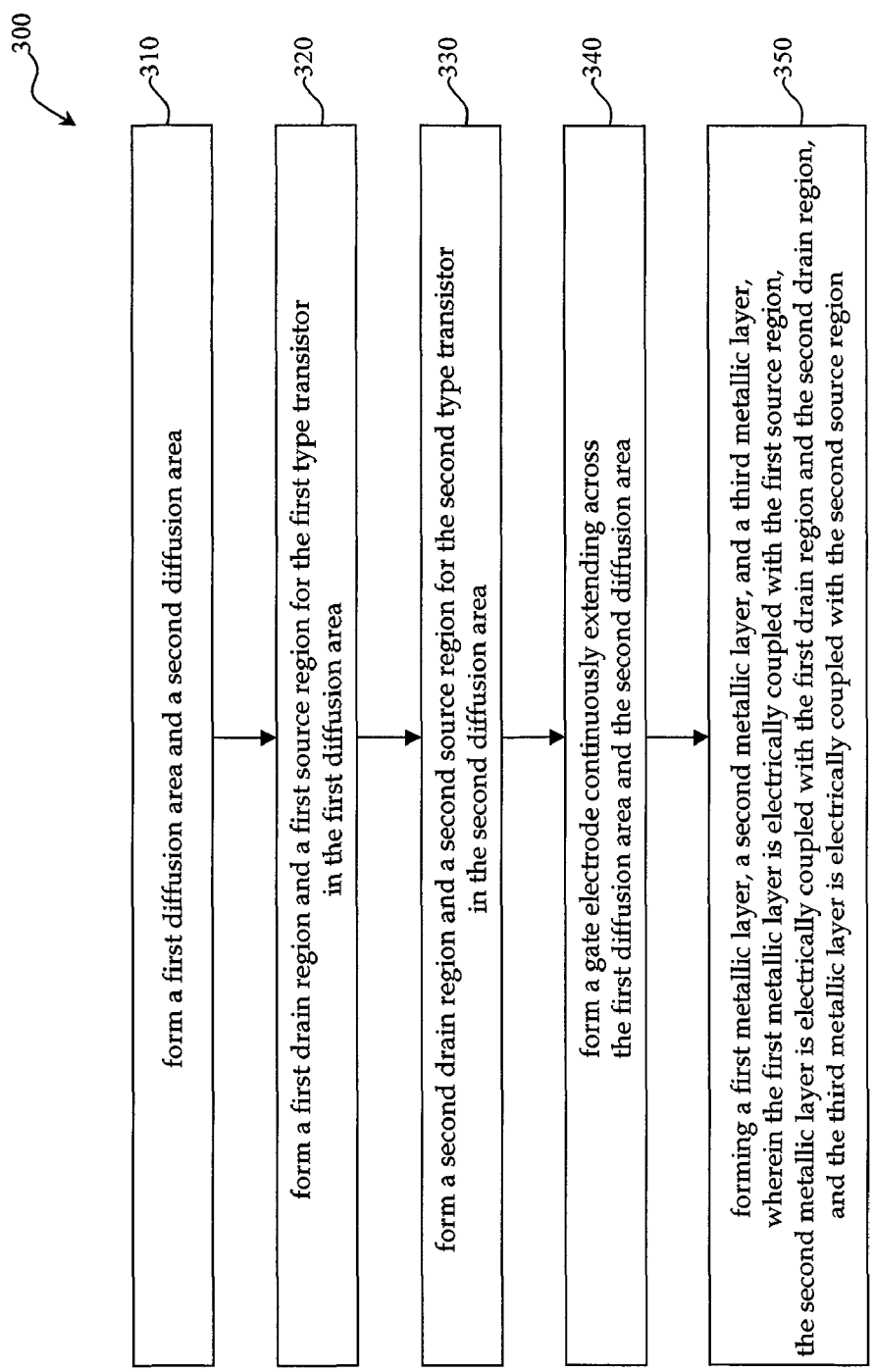
FIG. 3 is a flowchart illustrating an exemplary method of forming an integrated circuit.

FIG. 3 is a flowchart illustrating an exemplary method of forming an integrated circuit. FIGS. 4A-4E are schematic cross-sectional views illustrating another exemplary method of forming the integrated circuit 200 taken along a section line 2B-2B shown in FIG. 2A. In FIG. 3, a method 300 of forming an integrated circuit can include forming a first diffusion area and a section diffusion area on a substrate (process 310).

Figure 4A:
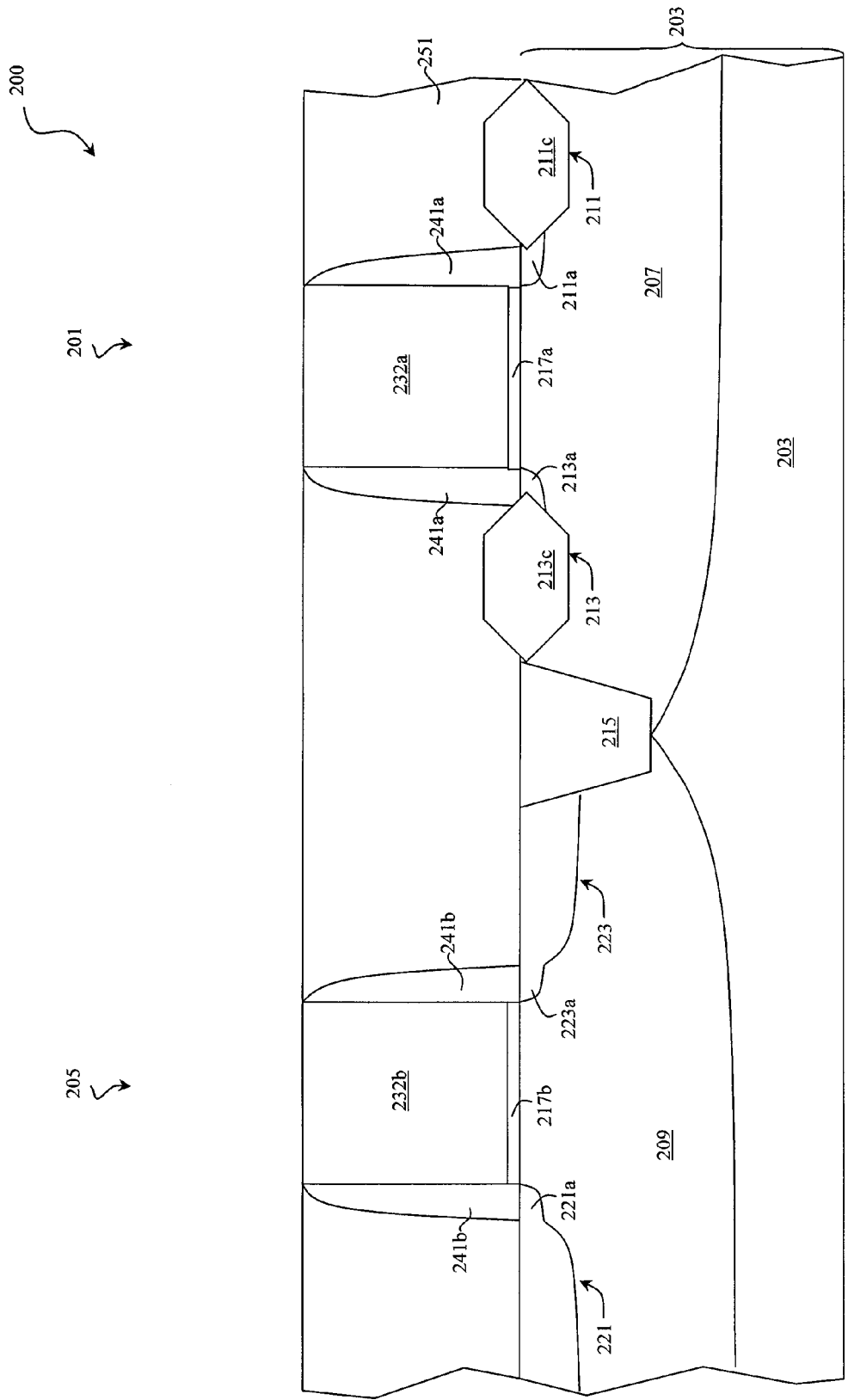
FIGS. 4A-4E are schematic cross-sectional views illustrating another exemplary method of forming an integrated circuit taken along a section line 2B-2B shown in FIG. 2A.
Figure 4B:
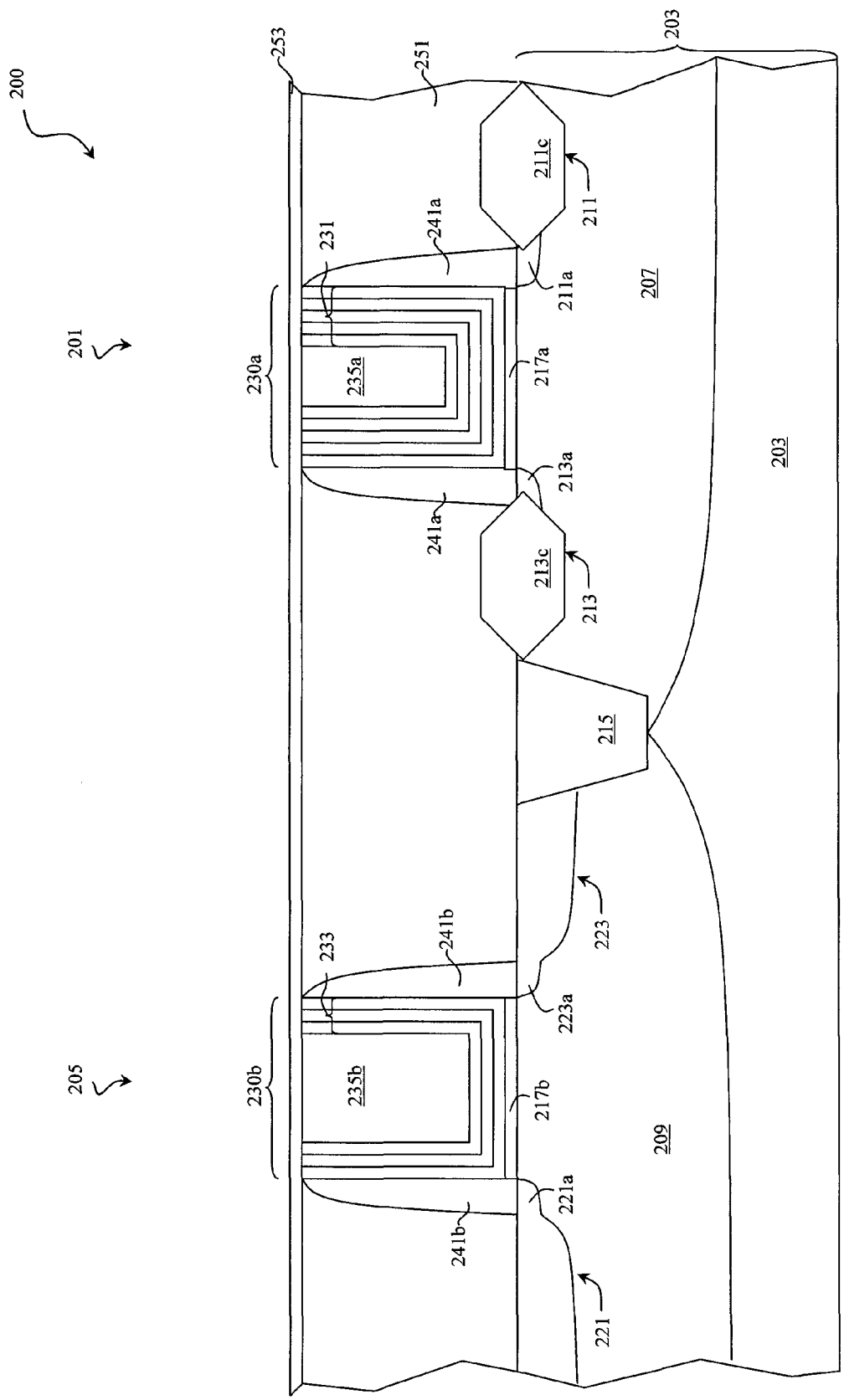

In some embodiments, the process 310 can form the diffusion areas 210 and 220 on the substrate 203 as shown in FIGS. 2A and 4A. In some embodiments, the process 310 can include forming the isolation structure 215 separating the diffusion area 210 from the diffusion area 220. In some embodiments, the formation of the isolation structure 215 may include patterning the semiconductor substrate 203 by a photolithographic process, etching a trench in the substrate (for example, by using a dry etching, wet etching, and/or plasma etching process), and filling the trench (for example, by using a chemical vapor deposition process) with a dielectric material. In some embodiments, the isolation structure 215 may have a multi-layer structure such as a thermal oxide liner layer filled with silicon nitride or silicon oxide. In some embodiments, the process 310 can be referred to as a STI process or a LOCOS process.

Referring to FIG. 4A, the N-type well region 207 and/or the P-type well region 209, in some embodiments, can be optionally formed in diffusion areas 201 and 205, respectively. The N-type well region 207 and/or the P-type well region 209 can be formed, for example, by photolithographic processes and ion implantation processes. In some embodiments, a thermal process and/or a rapid thermal process (RTP) can be performed to active dopants in the N-type well region 207 and/or the P-type well region 209.

Referring to FIG. 3, the method 300 can include forming a drain region and a source region for the first type transistor in the first diffusion area (process 320). In some embodiments forming the P-type transistor 201 as shown in FIG. 4A, the process 320 can form the source region 211 and the drain region 213. IN some embodiments, the source and drain regions 211 and 213 can each include a P-type heavily doped region that can be formed, for example, by a photolithographic process and an ion implantation process.

In other embodiments, the process 320 can include forming the structures 211c and 213c in the source region 211 and the drain region 213, respectively. The structures 211c and 213c can provide a stress to the channel of the P-type transistor 201. In some embodiments, the structures 211c and 213c can be formed by an epitaxial process, a reduced-pressure CVD (RPCVD) process, a molecular beam epitaxy (MBE) process, a chemical vapor deposition (CVD) process, a metal-organic chemical vapor deposition (MOCVD) process, an atomic layer deposition (ALD) process, a multi-layer epitaxial process, or any combinations thereof.

In some embodiments, the process 320 can optionally include forming the P-type LDDs 211a and 213a below spacers 241a. The P-type LDDs 211a and 213a can be formed, for example, by a tilt-angle ion implantation process. In some embodiments, silicide regions can be formed on the structures 211c and 213c before a process 340 forming gate electrode portions, wherein the process can be referred to as a silicide-first process. In other embodiments, the process 320 can include forming the silicide regions 211b and 211c described below in conjunction with FIG. 4C. In other some embodiments, a thermal process and/or a rapid thermal process (RTP) can be optionally performed to active dopants in the source region 211 and the drain region 213.

Referring again to FIG. 3, the method 300 can include forming a drain region and a source region for the second type transistor in the second diffusion area (process 330). In some embodiments forming the N-type transistor 205 as shown in FIG. 4A, the process 330 can form the source region 221 and the drain region 223. In some embodiments, the source and drain regions 221 and 223 can each include an N-type heavily doped region that can be formed, for example, by a photolithographic process and an ion implantation process.

In other embodiments, the process 330 can include forming a stress structure (not shown) in each of the source and drain regions 211 and 213. The stress structures can provide a stress to the channel of the N-type transistor 205 that is opposite to the stress provided by the structures 211c and 213c. The stress structures can be formed by an epitaxial process, a reduced-pressure CVD (RPCVD) process, a molecular beam epitaxy (MBE) process, a chemical vapor deposition (CVD) process, a metal-organic chemical vapor deposition (MOCVD) process, an atomic layer deposition (ALD) process, a multi-layer epitaxial process, or any combinations thereof.

In some embodiments, the process 330 can optionally include forming the N-type LDDs 221a and 223a below spacers 241b. The N-type LDDs 221a and 223a can be formed, for example, by a tilt-angle ion implantation process. In some embodiments, silicide regions can be formed on the source region 211 and the drain region 213 before the process 340 forming gate electrode portions, wherein the process can be referred to as a silicide-first process. In other embodiments, the process 330 can include forming the silicide regions 221b and 221c described below in conjunction with FIG. 4C. In other some embodiments, a thermal process and/or a rapid thermal process (RTP) can be optionally performed to active dopants in the source and drain regions 221 and 223. It is noted that the sequence of the processes 320 and 330 described above in conjunction with FIG. 3 can be switched. For example, the process 330 can be performed before the process 320. It is also noted that the process steps and/or their sequence in each of the processes 320 and 330 can be modified and/or switched. The scope of this application is not limited thereto.

Referring again to FIG. 3, the method 300 can include forming a gate electrode continuously extending across the first diffusion area and the second diffusion area (process 340). In some embodiments, the method can include forming a gate electrode 230 as shown in FIG. 2A.

The gate electrode 230 can be formed by a gate-first process or a gate-last process. In some embodiments using a gate-last process, the process 340 can include forming dummy gate electrodes 232a and 232b over the substrate 203 as shown in FIG. 4A. The dummy gate electrodes 232a and 232b can be made of at least one material such as polysilicon, amorphous silicon, silicon oxide, silicon nitride, a material having an etching rate that is substantially different from the dielectric layer 251 and/or the spacers 241a-241b. In some embodiments, the dummy gate electrodes 232a and 232b can be formed by a CVD process.

The process 340 can include removing the dummy gate electrodes 232a and 232b, for example, by a wet etch process, a dry etch process, or any combinations thereof. After removing the dummy gate electrodes 232a and 232b, the process 340 can include forming gate electrode portions 230a and 230b over the substrate 203. The gate electrode portions 230a and 230b can include multi-layer structures 231, 233 and conductive layers 235a, 235b, respectively. The multi-layer structures 231 and 233 can be formed, for example, by any suitable process, such as an ALD process, CVD process, a physical vapor deposition (PVD) process, a reduced-pressure CVD (RPCVD) process, a PECVD process, an MOCVD process, or any combinations thereof. The conductive layers 235a and 235b can be formed, for example, by any suitable process, such as an ALD process, CVD process, a physical vapor deposition (PVD) process, a reduced-pressure CVD (RPCVD) process, a PECVD process, an MOCVD process, a plating process, a sputtering process, or any combinations thereof. After the formation of the gate electrode portions 230a and 230b, an ESL layer 253 can be formed over the gate electrode portions 230a and 230b, for example, by a CVD process.

Referring again to FIG. 3, the method 300 can include forming a first metallic layer, a second metallic layer, and a third metallic layer (process 350). The first metallic layer can be electrically coupled with the first source region, the second metallic layer can be electrically coupled with the first drain region and the second drain region, and the third metallic layer can be electrically coupled with the second source region.

In some embodiments forming the metallic layers in a manner that is similar to the sectional view shown in FIG. 1B, the dielectric layer 155 can be formed over the ESL layer 153. The metallic layers 140, 150, and 160 can be formed through the dielectric layers 151, 155 and the ESL layer 153, such that the metallic layers 140, 150, and 160 can directly contact the respective source and drain regions 111, 113, 121, and 123.

Figure 4C:
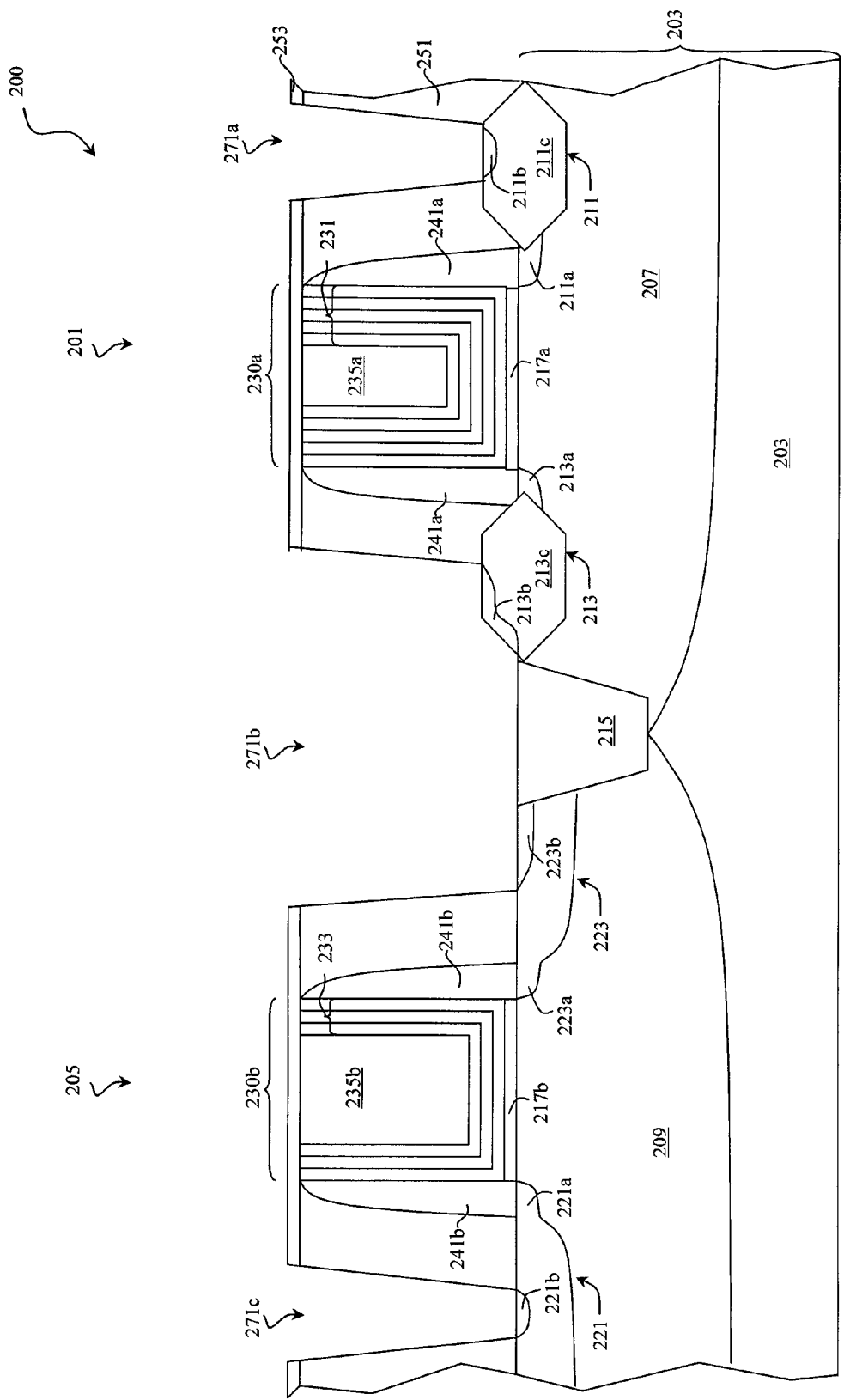

In some embodiments forming the metallic layers in a manner that is similar to the structures shown in FIGS. 2A-2B, the method 300 can further include forming metallic layers 270a-270d that are electrically coupled with the respective metallic layers 240, 250, and 260. In some embodiments, the method 300 can include forming openings 271a-271c through the dielectric layer 251 and the ESL 253. The openings 271a-271c can at least partially expose the respective source and drain regions 211, 213, 221, and 223 as shown in FIG. 4C.

In some embodiments, after forming the openings 271a-271c, silicide regions 211b, 213b, 221b, and 223b can be formed in the respective source and drain regions 211, 213, 221, and 223. As noted, the silicide regions 211b, 213b, 221b, and 223b shown in FIG. 4C are formed after the formation interfacial layers 217a-217b and the high-k dielectric layers of the multi-layer structures 231 and 233. The silicide regions 211b, 213b, 221b, and 223b are free from being subjected to thermal cycles of forming the interfacial layers 217a-217b and the high-k dielectric layers of the multi-layer structures 231 and 233. In some embodiments, the process of forming the silicide regions 211b, 213b, 221b, and 223b can be referred to as a silicide-last process.

Figure 4D:
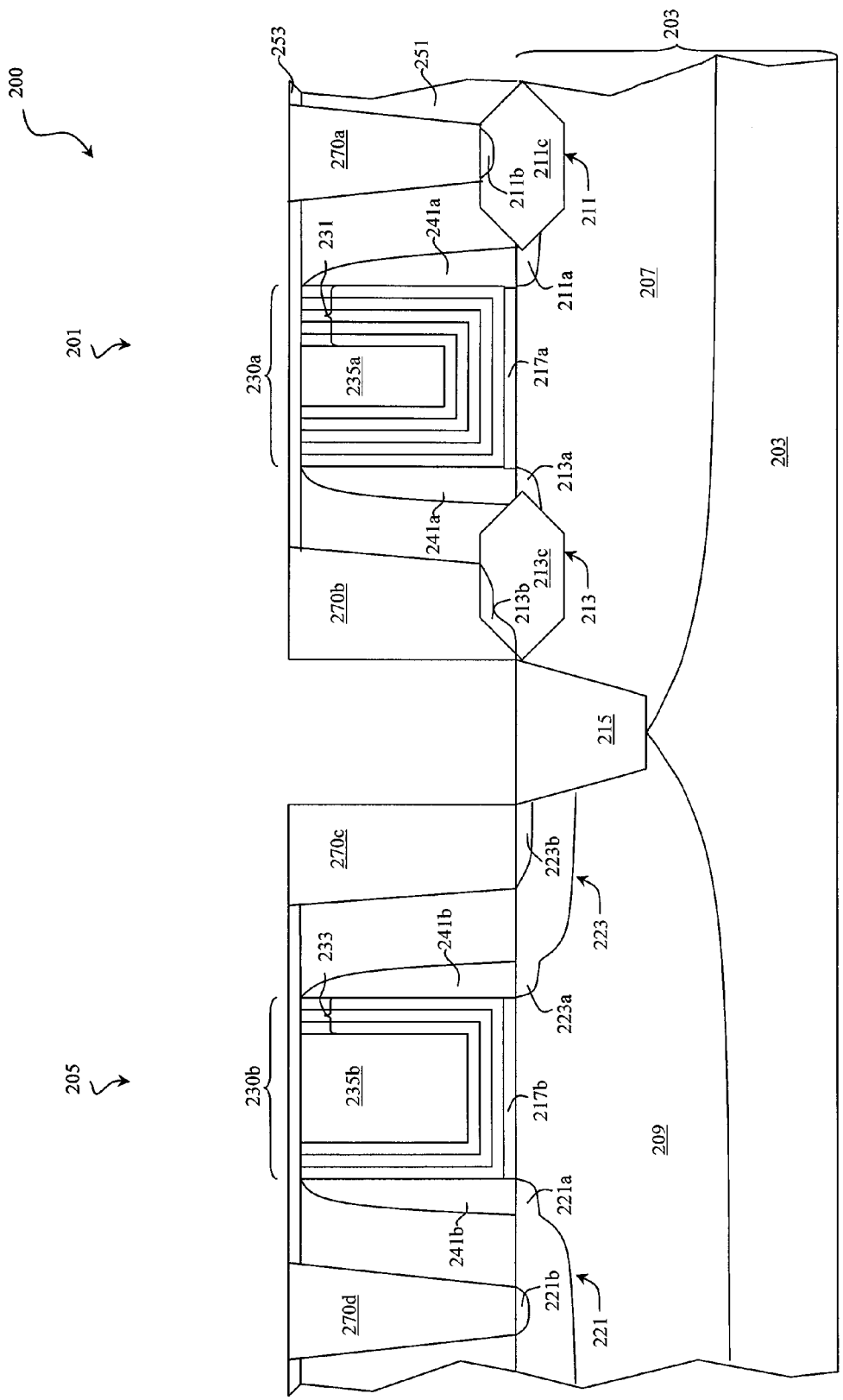

Referring to FIG. 4D, the method 300 can include forming metallic layers 270a-270d directly contacting the respective source and drain regions 211, 213, 221, and 223. The metallic layers 270a-270d can be formed, for example, by depositing a PVD process, a CVD process, an ALD process, a sputtering process, a plating process, other suitable methods, or any combinations thereof.

Figure 4E:
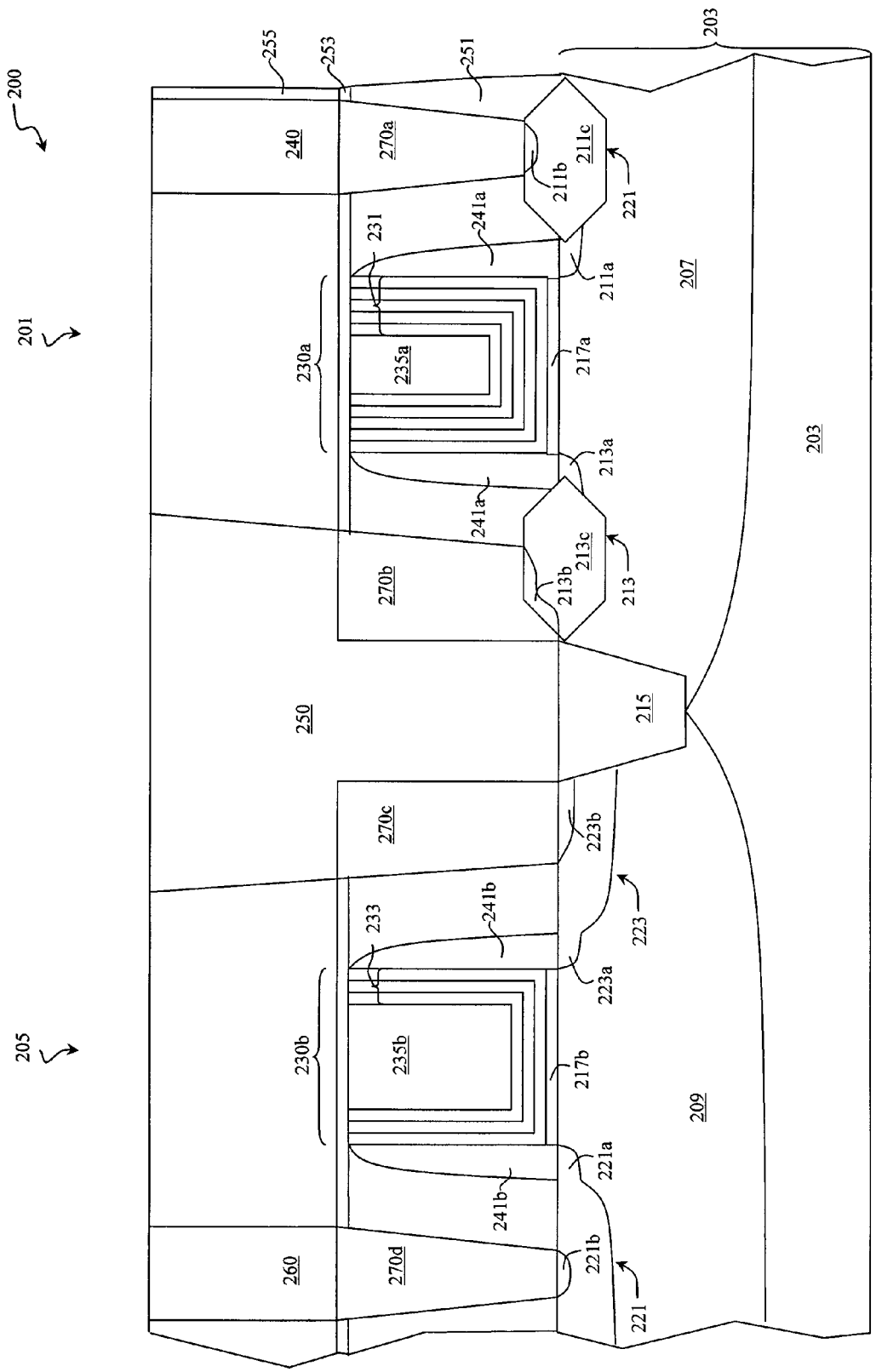

Referring to FIG. 4E, the process 350 (shown in FIG. 3) can include forming the metallic layers 240, 250, and 260 that are electrically coupled with the respective metallic layers 270a-270d. In some embodiments, the process 350 can include forming openings (not labeled) through the dielectric layer 255. The openings can at least partially expose the respective metallic layers 270a-270d. The metallic layers 240, 250, and 260 are then formed within the openings, electrically coupling with the respective metallic layers 270a-270d. In some embodiments, the metallic layers 240, 250, and 260 can be formed, for example, by depositing a PVD process, a CVD process, an ALD process, a sputtering process, a plating process, other suitable methods, and/or combinations thereof.

Figure 5:
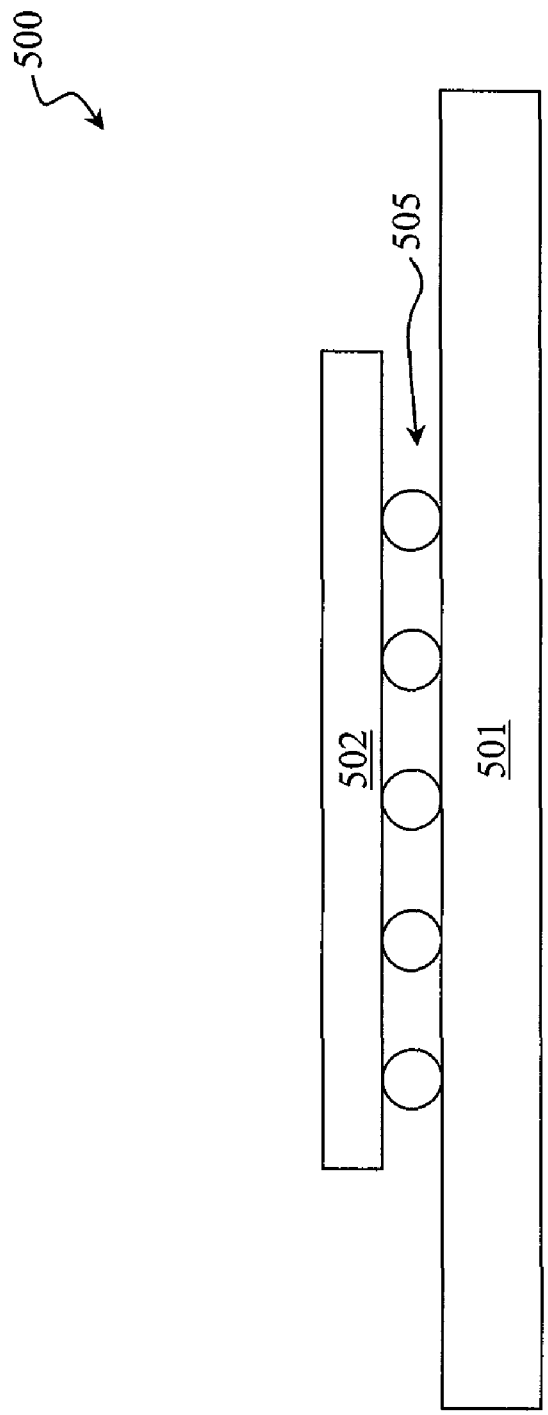
FIG. 5 is a schematic drawing illustrating a system including an exemplary integrated circuit disposed over a substrate board.
Figure 2B:
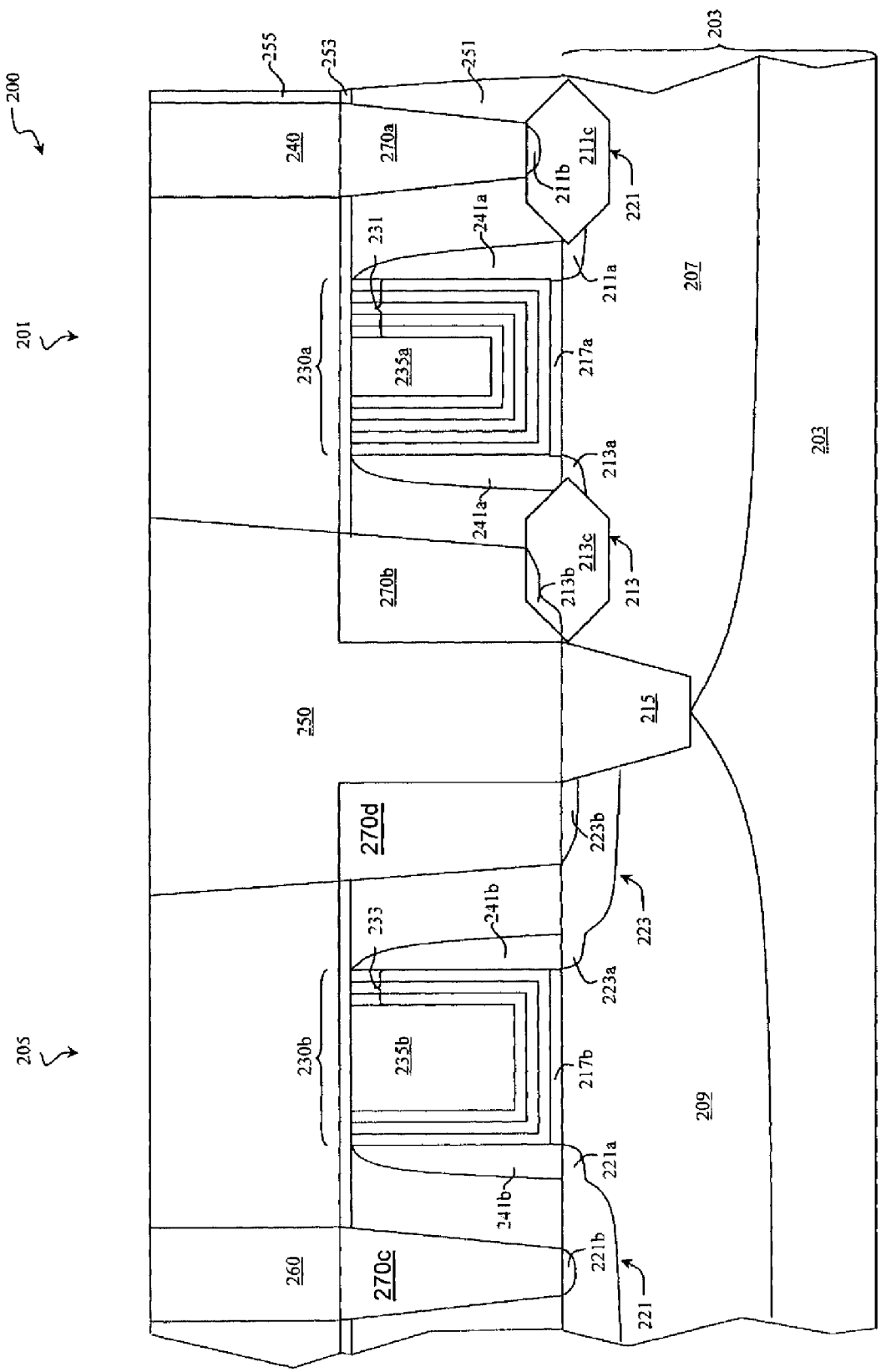
Figure 4D:
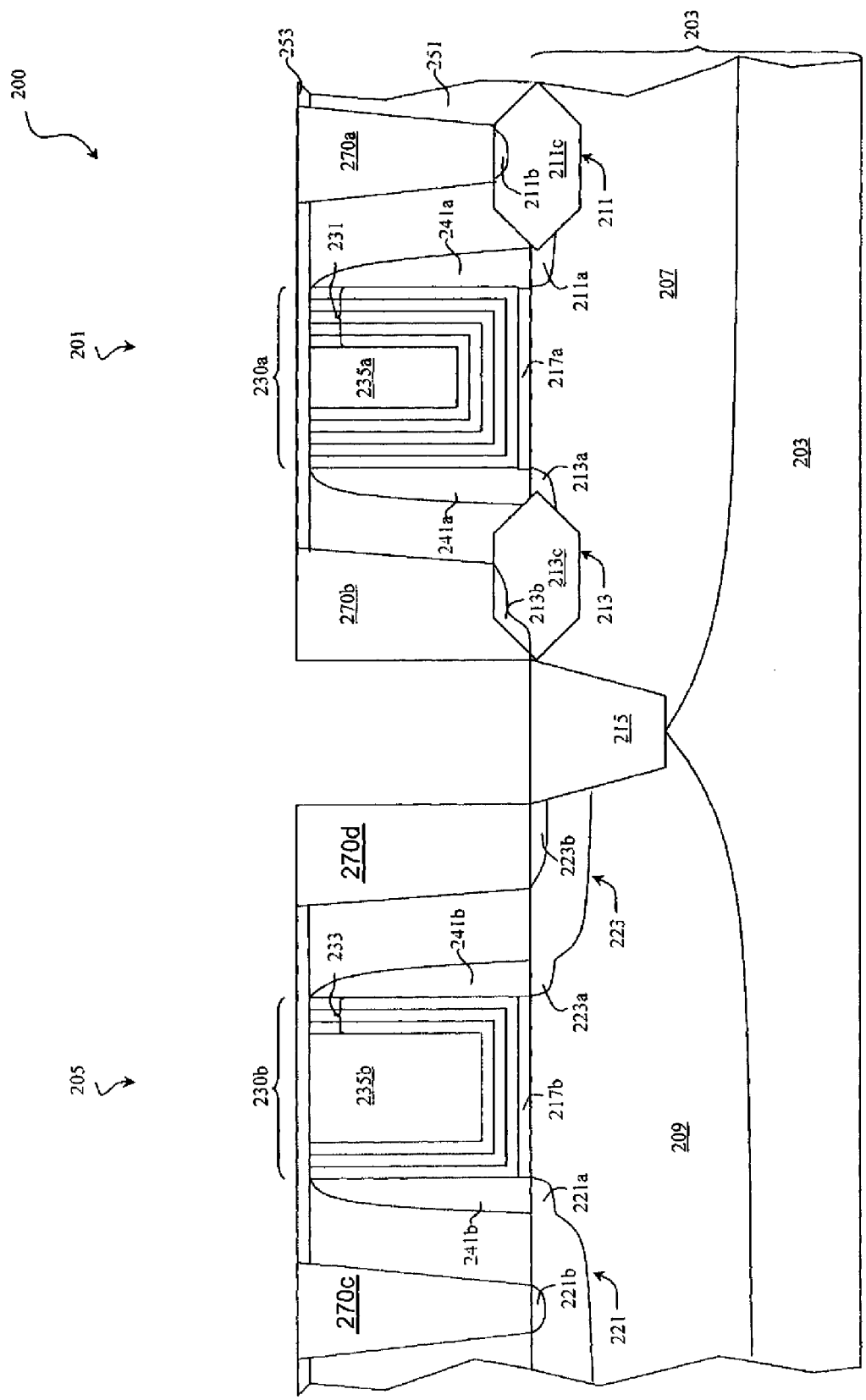
Figure 4E:
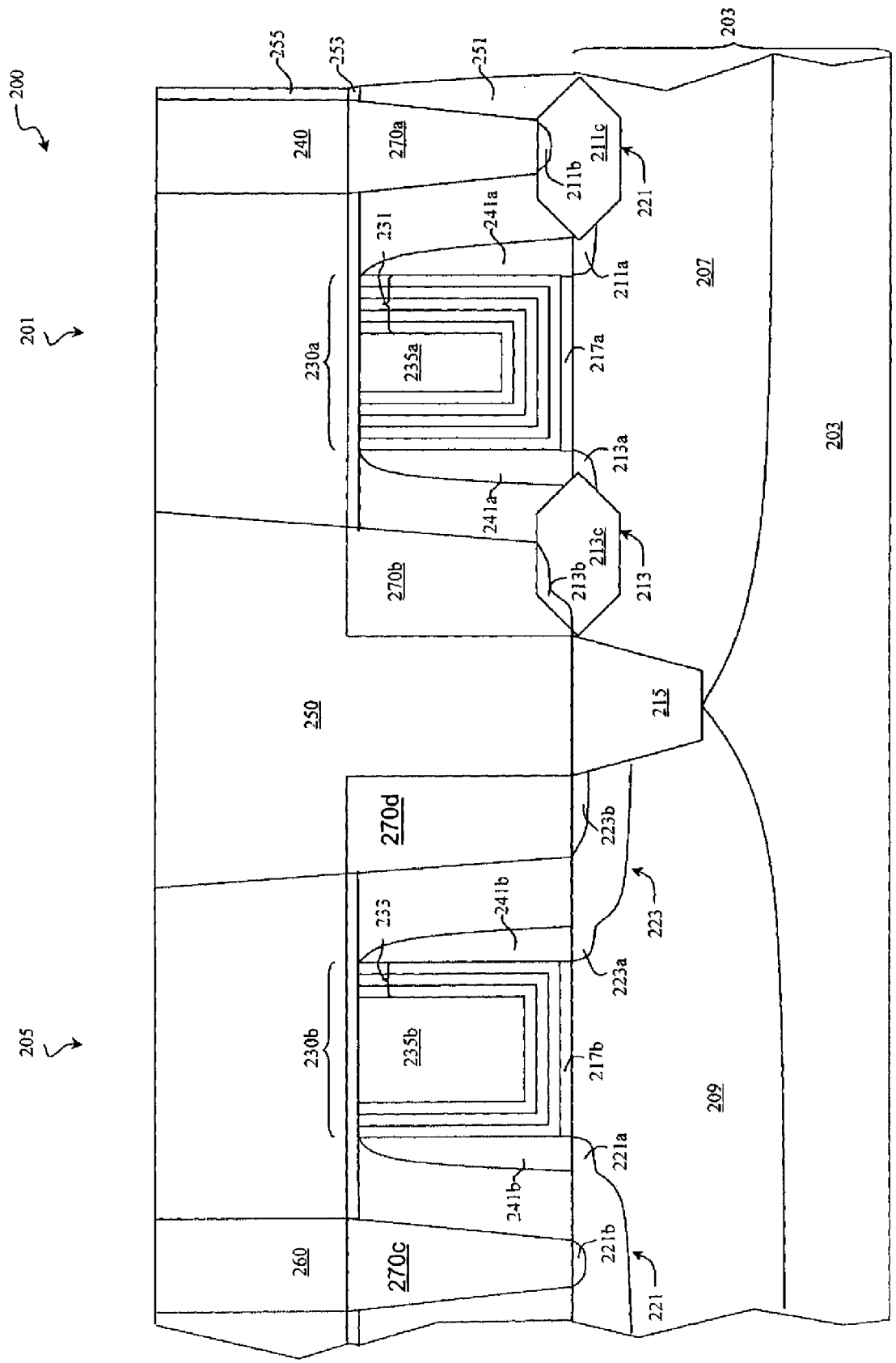

FIG. 5 is a schematic drawing illustrating a system including an exemplary integrated circuit disposed over a substrate board. In FIG. 5, a system 500 can include an integrated circuit 502 disposed over a substrate board 501. The substrate board 501 can include, in some embodiments, a printed circuit board (PCB), a printed wiring board and/or other carrier that is capable of carrying an integrated circuit. The integrated circuit 502 can be similar to the integrated circuit 100 or 200 described above in conjunction with FIGS. 1A-1B and 2A-2B, respectively. The integrated circuit 502 can be electrically coupled with the substrate board 501. In some embodiments, the integrated circuit 502 can be electrically coupled with the substrate board 501 through bumps 505. In other embodiments, the integrated circuit 502 can be electrically coupled with the substrate board 501 through wire bonding (not shown). The system 500, in some embodiments, can be part of an electronic system such as computers, wireless communication devices, computer-related peripherals, entertainment devices, or the like.

In some embodiments, the system 500 including the integrated circuit 502 can provide an entire system in one IC, so-called system-on-chip (SOC) or system-on-integrated-circuit (SOIC) devices. These SOC/SOIC devices may provide, for example, all of the circuitry needed to implement a cell phone, personal data assistant (PDA), digital VCR, digital camcorder, digital camera, MP3 player, or the like in a single integrated circuit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit comprising:
a first diffusion area for a first type transistor, the first type transistor including a first drain region and a first source region in the first diffusion area;
a second diffusion area for a second type transistor, the second diffusion area being spaced from the first diffusion area, the second type transistor including a second drain region and a second source region in the second diffusion area;
a gate electrode continuously extending across the first diffusion area and the second diffusion area in a routing direction;
a first metallic layer electrically coupled with the first source region, the first metallic layer and the first diffusion area overlapping with a first distance in the routing direction;
a second metallic layer electrically coupled with the first drain region and the second drain region, the second metallic layer and the first diffusion area overlapping with a second distance in the routing direction, wherein the first distance is larger than the second distance; and
a third metallic layer electrically coupled with the second source region, the third metallic layer and the second diffusion area overlapping with a third distance in the routing direction,
wherein the second metallic layer and the second diffusion area are overlapped by a fourth distance in the routing direction, and the third distance is larger than the fourth distance.

2. The integrated circuit of claim 1, wherein the first diffusion area has a first width, a ratio of the first distance to the first width is between about 0.75:1 to about 1:1 and a ratio of the second distance to the first width is between about 0.1:1 to about 0.33:1.

3. The integrated circuit of claim 1, wherein the third distance is larger than the second distance.

4. The integrated circuit of claim 1, wherein the second diffusion area has a second width, a ratio of the third distance to the second width is between about 0.75:1 to about 1:1, and a ratio of the fourth distance to the second width is between about 0.1:1 to about 0.33:1.

5. The integrated circuit of claim 1, wherein the first metallic layer directly contacts the first source region, the second metallic layer directly contacts the first and second drain regions, and the third metallic layer directly contacts the second source region.

6. The integrated circuit of claim 1, further comprising:
a plurality of fourth metallic layers each directly contacting one of the first and second drain regions and the first and second source regions, wherein the plurality of fourth metallic layers each at least partially overlaps one of the first, second, and third metallic layers in the routing direction.

7. The integrated circuit of claim 6, wherein the plurality of fourth metallic layers each substantially continuously extends, in the routing direction, from an edge to an opposite edge of the first diffusion area or the second diffusion area.

8. The integrated circuit of claim 1, wherein a sum of the first distance and the second distance substantially equals a width of the first diffusion area.

9. An integrated circuit comprising:
a first diffusion area for a first type transistor, the first type transistor including a first drain region and a first source region in the first diffusion area;
a second diffusion area for a second type transistor, the second diffusion area being spaced from the first diffusion area, the second type transistor including a second drain region and a second source region in the second diffusion area;
a gate electrode continuously extending across the first diffusion area and the second diffusion area in a routing direction;
a first metallic layer electrically coupled with the first source region, the first metallic layer and the first diffusion area overlapping with a first distance in the routing direction;
a second metallic layer electrically coupled with the first drain region and the second drain region, the second metallic layer and the first diffusion area overlapping with a second distance in the routing direction, wherein the first distance is larger than the second distance;
a third metallic layer electrically coupled with the second source region, the third metallic layer and the second diffusion area overlapping with a third distance in the routing direction, wherein the second metallic layer and the second diffusion area are overlapped by a fourth distance in the routing direction, and the third distance is larger than the fourth distance; and
a plurality of fourth metallic layers each directly contacting one of the first and second drain regions and the first and second source regions, wherein the plurality of fourth metallic layers each at least partially overlaps one of the first, second, and third metallic layers in the routing direction, and wherein the first, second, and third metallic layers are electrically coupled with the respective source and drain regions through the respective fourth metallic layers.

10. The integrated circuit of claim 9, wherein the third distance is larger than the second distance.

11. The integrated circuit of claim 9, wherein the first diffusion area has a first width, a ratio of the first distance to the first width is between about 0.75:1 to about 1:1, and a ratio of the second distance to the first width is between about 0.1:1 to about 0.33:1.

12. The integrated circuit of claim 9, wherein the second diffusion area has a second width, a ratio of the third distance to the second width is between about 0.75:1 to about 1:1, and a ratio of the fourth distance to the second width is between about 0.1:1 to about 0.33:1.

13. The integrated circuit of claim 9, wherein the first metallic layer directly contacts the first source region, the second metallic layer directly contacts the first and second drain regions, and the third metallic layer directly contacts the second source region.

14. The integrated circuit of claim 9, wherein the plurality of fourth metallic layers each substantially continuously extends, in the routing direction, from an edge to an opposite edge of the first diffusion area or the second diffusion area.

15. An integrated circuit comprising:
a first diffusion area for a first type transistor, the first type transistor including a first drain region and a first source region in the first diffusion area;
a second diffusion area for a second type transistor, the second diffusion area being spaced from the first diffusion area, the second type transistor including a second drain region and a second source region in the second diffusion area;
a gate electrode continuously extending across the first diffusion area and the second diffusion area in a routing direction;
a first metallic layer electrically coupled with the first source region, the first metallic layer and the first diffusion area overlapping with a first distance in the routing direction;
a second metallic layer electrically coupled with the first drain region and the second drain region, the second metallic layer and the first diffusion area overlapping with a second distance in the routing direction, wherein the first distance is larger than the second distance;
a third metallic layer electrically coupled with the second source region, the third metallic layer and the second diffusion area overlapping with a third distance in the routing direction, wherein the second metallic layer and the second diffusion area are overlapped by a fourth distance in the routing direction, and the third distance is larger than the fourth distance; and
a plurality of fourth metallic layers, wherein each of the first metallic layer, the second metallic layer and the third metallic layer are separated from the first diffusion area or the second diffusion area by at least one of the plurality of fourth metallic layers.

16. The integrated circuit of claim 15, wherein at least one of the plurality of fourth metallic layers continuously extends, in the routing direction, a distance at most 5% different from a dimension, in the routing direction, of the first diffusion area or the second diffusion area.

17. The integrated circuit of claim 15, wherein at least one of the plurality of fourth metallic layers is electrically connected to a silicide region of the first diffusion area or the second diffusion area.

18. The integrated circuit of claim 17, further comprising a barrier layer between the at least one fourth metallic layer and the silicide region.

19. The integrated circuit of claim 15, wherein the first diffusion area has a first width, a ratio of the first distance to the first width is between about 0.75:1 to about 1:1, and a ratio of the second distance to the first width is between about 0.1:1 to about 0.33:1.

20. The integrated circuit of claim 15, wherein the second diffusion area has a second width, a ratio of the third distance to the second width is between about 0.75:1 to about 1:1, and a ratio of the fourth distance to the second width is between about 0.1:1 to about 0.33:1.

* * * * *

UNITED STATES PATENT AND TRADEMARK OFFICE
CERTIFICATE OF CORRECTION

| | | |
|---|---|---|
| PATENT NO. | : 8,362,573 B2 | Page 1 of 4 |
| APPLICATION NO. | : 12/787966 | |
| DATED | : January 29, 2013 | |
| INVENTOR(S) | : Chung-Cheng Wu et al. | |

It is certified that error appears in the above-identified patent and that said Letters Patent is hereby corrected as shown below:

In the Drawings

Delete Drawing Sheets 4, 9, and 10 and substitute therefore with the attached Drawing Sheets 4, 9, and 10 consisting of FIGS. 2B, 4D, and 4E.

In the Specification

Column 8, Lines 65-67 should read as follows:

FIG. 2B is a cross-sectional view of an exemplary integrated circuit taken along a section line 2B-2B shown in FIG. 2A. In FIG. 2B, the metallic structures 270a-270d can directly Column 9, Lines 1-9 should read as follows:

contact the source region 211, the drain regions 213, 223, and source region 221. The metallic structures 240, 250, and 260 can be electrically coupled with the source region 211, the drain regions 213, 223, and the source region 221 through the metallic structures 270a-270d. In some embodiments, the metallic structures 270a-270d can be disposed through the dielectric layer 251 and the ESL 253, directly contacting the silicide regions 211b, 213b, 221b, and 223b, respectively.

Signed and Sealed this
Twenty-first Day of April, 2015

Michelle K. Lee
*Director of the United States Patent and Trademark Office*